United States Patent
Schmidhammer

(10) Patent No.: US 8,791,873 B2
(45) Date of Patent: Jul. 29, 2014

(54) IMPEDANCE ADJUSTMENT CIRCUIT FOR ADJUSTING PLANAR ANTENNAS

(75) Inventor: Edgar Schmidhammer, Stein an der Traun (DE)

(73) Assignee: Qualcomm Technologies, Inc., San Diego, CA (US)

( * ) Notice: Subject to any disclaimer, the term of this patent is extended or adjusted under 35 U.S.C. 154(b) by 483 days.

(21) Appl. No.: 13/142,397

(22) PCT Filed: Dec. 29, 2009

(86) PCT No.: PCT/EP2009/068010
§ 371 (c)(1),
(2), (4) Date: Aug. 25, 2011

(87) PCT Pub. No.: WO2010/081635
PCT Pub. Date: Jul. 22, 2010

(65) Prior Publication Data
US 2011/0298685 A1    Dec. 8, 2011

(30) Foreign Application Priority Data

Jan. 15, 2009    (DE) .......................... 10 2009 004 720

(51) Int. Cl.
*H01Q 1/50*    (2006.01)
(52) U.S. Cl.
USPC .......................................... 343/861; 343/860
(58) Field of Classification Search
USPC ................. 343/860, 861, 702, 700 MS, 846
See application file for complete search history.

(56) References Cited

U.S. PATENT DOCUMENTS

| 4,015,223 | A | * | 3/1977 | Cheze .......................... 333/17.3 |
| 5,778,308 | A | | 7/1998 | Sroka et al. |
| 6,469,590 | B1 | * | 10/2002 | Lewis et al. .................. 333/17.3 |
| 6,670,864 | B2 | | 12/2003 | Hyvönen et al. |
| 7,242,364 | B2 | * | 7/2007 | Ranta ............................. 343/860 |
| 7,324,054 | B2 | * | 1/2008 | Ozkar ............................. 343/702 |
| 2004/0087286 | A1 | | 5/2004 | Inoue et al. |
| 2008/0021525 | A1 | * | 1/2008 | Solzbacher et al. ............ 607/61 |

FOREIGN PATENT DOCUMENTS

| DE | 36 44 477 A1 | 7/1988 |
| DE | 695 31 804 T2 | 7/2004 |
| DE | 601 25 100 T2 | 7/2007 |
| EP | 0 685 936 A2 | 12/1995 |
| EP | 0 795 922 A1 | 9/1997 |
| EP | 1 988 641 A1 | 11/2008 |
| JP | 08-154007 A | 6/1996 |
| JP | 10 209897 A | 8/1998 |
| WO | WO 2006/129239 A1 | 12/2006 |

OTHER PUBLICATIONS

International Search Report—PCT/EP2009/068010—ISA/EPO—Apr. 22, 2010.

* cited by examiner

*Primary Examiner* — Thien M Le
(74) *Attorney, Agent, or Firm* — Smith Risley Tempel Santos LLC

(57) ABSTRACT

An impedance matching circuit for matching planar antennas includes a signal path with a signal path input and a signal path output. A first capacitive element with variable capacitance is connected between the signal path input and signal path output. A second capacitive element with variable capacitance is connected between the signal path and ground. A first inductive element is connected between the signal path input and ground. A second inductive element is connected between the signal path output and ground. An antenna line with an impedance between 30 and 60 ohm is connected to the signal path output.

19 Claims, 4 Drawing Sheets

IMPEDANCE ADJUSTMENT CIRCUIT FOR ADJUSTING PLANAR ANTENNAS

This patent application is a national phase filing under section 371 of PCT/EP2009/068010, filed Dec. 29, 2009, which claims the priority of German patent application 10 2009 004 720.4, filed Jan. 15, 2009, each of which is incorporated herein by reference in its entirety.

TECHNICAL FIELD

The invention concerns an impedance matching circuit to match the impedance of planar antennas of the PIFA type (Planar Inverted F Antenna).

BACKGROUND

Planar antennas are antennas that are not adjusted to a specific impedance, but rather require a matching circuit for maximum power transmission. Matching is necessary if the power loss in signal transmission to a non-impedance-matched antenna is to be reduced. Planar antennas, as are used in mobile communications equipment, react by a change of their impedance to changed external effects or proximity to objects such as hands or other body parts of a user, or even metal surfaces.

Connecting a planar antenna to an associated impedance matching circuit is known, for example, from the publication WO 2006/129239 A1. Besides a number of inductive elements, its impedance matching circuit comprises a number of MEMS switches as capacitive elements. The capacitance of a MEMS switch can take two discrete values. A sufficient tuning range for impedance matching is enabled by a plurality of interconnected MEMS switches.

One problem of known impedance matching circuits for planar antennas lies in the fact that either the tuning range is too small or the impedance matching circuit is very complicated and has a large number of interconnected elements. The latter leads to a relatively high susceptibility to defects.

SUMMARY OF THE INVENTION

In one aspect, the present invention specifies an impedance matching circuit with reduced complexity and a reduced number of circuit elements that nevertheless enables a sufficient tuning range.

The impedance matching circuit in accordance with the invention comprises a signal path with a signal path input and a signal path output, and a first capacitive element with variable capacitance connected between the signal path input and the signal path output. It further comprises a second variable capacitive element that is connected between the signal path and ground. Further, a first inductive element is connected between the signal path input and ground and a second inductive element is connected between the signal path output and ground. An antenna feed that has an impedance between 30 and 60 ohms is connected to the signal path output.

Such a circuit, whose signal path input can, for example, be connected to the sending and receiving paths of a front end circuit for mobile radio equipment and whose antenna feed is intended for connection to a planar antenna of PIFA type is a simple, i.e., less complicated, circuit for impedance matching the antenna to the front end circuit. Such an impedance matching circuit can produce matching to 50 ohm of a PIFA, for example. In particular, environmental effects that have a negative effect on the impedance matching of the PIFA (for example, different antenna directions, and objects in the vicinity of the antenna such as hands or desk surfaces) can be counteracted with it. In addition, such an impedance matching circuit enables simultaneous matching in the sending and receiving bands. The two inductive elements not only determine the frequency behavior of the PIFA, but also act as ESD protective elements to protect, for example, the connected front end circuit or its individual components against current pulses that act via the antenna, by discharging these pulses harmlessly to ground.

In a preferred embodiment, the second capacitive element is connected between the signal path output and ground, while in an alternative embodiment, the second variable capacitive element is connected between the signal path input and ground.

In another preferred embodiment, a resistive element with voltage-dependent resistance is connected between the signal path output and ground. Such a resistive element can, in particular, be a varistor.

The two inductive elements preferably have Q factors greater than or equal to 15 and their inductances are between 1 and 30 nH. The first capacitive element preferably has a Q factor greater than or equal to 10 and its capacitance is adjustable in an interval that lies between 0.5 and 13 pF. The second capacitive element also preferably has a Q factor greater than or equal to 10. Its capacitance is adjustable in an interval that lies between 0.5 and 8.0 pF.

In an advantageous embodiment, the impedance matching circuit is used in a mobile communications device with a sending path and a receiving path and a planar antenna of PIFA type. The signal path input is connected to the sending path and the receiving path and the antenna feed is connected to the PIFA. A duplexer can be connected between the sending and receiving path on the one hand and the signal path on the other. Then data transmission in FDD (frequency division duplexing) mode is possible. Alternatively or additionally, the sending and receiving path on the one hand and the signal path input on the other hand can also be connected via switches that enable data transmission in TDD (time division duplexing) mode.

In both variations it is advantageous if the sending path is matched in a sending frequency band with a standing wave ratio in the sending path that is less than 3:1 and if the receiving path is matched in a receiving frequency band with a standing wave ratio in the receiving path that is less than 4:1.

The impedance matching circuit in accordance with the invention is especially suitable for use in W-CDMA frequency bands between 500 and 4500 megahertz.

The tuning range of at least one of the first and second variable capacitive elements is preferably at least 2.5:1. Likewise, it is possible for the tuning range of both capacitive elements to be at least 2.5:1. The first or the second variable capacitive element can be an adjustable capacitor with a barium strontium titanate dielectric layer. Alternatively, it can also be a capacitive element made in CMOS technology, a circuit of MEMS capacitors, a semiconductor varactor diode, a capacitive element made in NMOS technology, or a gallium arsenide capacitive element. The first or the second capacitive element can be a circuit of capacitive components connected in parallel to each other (a so-called array), where the capacitive components can be coupled or connected individually by switches. In such an array, the individual capacitive components preferably have capacitances increasing by powers of two that are different from each other and correspond in each case to a whole number that is $2^n$ times (n=1, 2, 3, . . . ) the smallest capacitance value occurring in the array. Through this, it is possible to adjust the total capacitance in equidistant, discrete steps. A so-called 5-bit array, for example, offers a maximum of $2^5=32$ adjustment possibilities. However, the number of adjustment possibilities can also be 16 in cases with less circuitry cost (corresponds to a 4-bit array), 64 (corresponds to a 6-bit array) or 128 or 256 (corresponds to a 7- or 8-bit array). The higher the number of components and thus also the number of the corresponding control lines, the more costly the circuit will be, but the better the desired capacitance that can be established. Further, it is possible for both capacitive elements to be elements of the same design.

The inductive elements are preferably designed as metallizations in a multilayer substrate. The multilayer substrate can comprise HTCC (high-temperature cofired ceramics), LTCC (low-temperature cofired ceramics), FR4 or a laminate.

The variable capacitance capacitive elements can be of the same type. In particular, it is preferred that both capacitive elements are arranged in a common housing or at least have a jointly used cover.

It is also preferred if both variable capacitive elements jointly use the same control lines, with which the capacitance of the capacitive elements can be varied.

Possibilities as the frequency range in which the impedance matching circuit matches the antenna impedance are a range between 0.5 gigahertz and 1.7 gigahertz or the range between 1.7 gigahertz and 2.5 gigahertz. In addition, impedance matching can also be possible and intended at frequencies greater than or equal to 2.5 gigahertz. In order to cover several frequency ranges, it is possible to provide an impedance matching circuit in accordance with the invention for each frequency range that is to be covered, that is active and switched on in the corresponding frequency range.

To achieve an improvement of the Q factors of the first or the second capacitive elements, it can be advantageous to connect these variable capacitive elements in parallel with other capacitive elements that have given fixed capacitance.

It is further preferred to connect a directional coupler in the signal path. If there is more than one impedance matching circuit for different frequency ranges, it is possible to allocate to each individual impedance matching circuit its own directional coupler, which is connected in the signal path. Alternatively, it is also possible for a dual band directional coupler to be jointly connected to the two signal paths of two different impedance matching circuits.

Further, two or more impedance matching circuits can be connected in a multiband matching circuit. Each impedance matching circuit then can have its own allotted directional coupler, which is connected to the corresponding signal path. A multiband matching circuit can, however, also comprise a number of impedance matching circuits, where two or more signal paths of the impedance matching circuits are connected to the same multiband directional coupler. A multiband matching circuit is a circuit that enables impedance matching in a number of frequency ranges. Front end circuits of mobile telephones, which comprise several signal paths in different impedance matching circuits, can cover a different frequency range with each of these circuits. Such circuits therefore are intended for use in a number of frequency ranges.

With a single impedance matching circuit comprising variable capacitance elements, it is also possible to match the impedance in different frequency ranges.

BRIEF DESCRIPTION OF THE DRAWINGS

Below, the impedance matching circuit will be explained in more detail by means of embodiment examples and pertinent schematic drawings.

The following list of reference symbols may be used in conjunction with the drawings:

| | |
|---|---|
| AL | Antenna line |
| ASL | Control line |
| C1, C2 | Variable capacitive element |
| DBRK | Dual band directional coupler |
| EP | Receiving path |
| IAS, IAS1, IAS2 | Impedance matching circuit |
| L1, L2 | Inductive element |
| M | Ground |
| MBAS | Multiband matching circuit |
| PIFA | Planar inverted F antenna |
| RK | Directional coupler |
| SeP | Sending path |
| SP | Signal path |
| SPA | Signal path output |
| SPE | Signal path input |
| Va | Voltage-dependent resistive element |
| WCE | Additional capacitive element |

DETAILED DESCRIPTION OF ILLUSTRATIVE EMBODIMENTS

Figure 1:
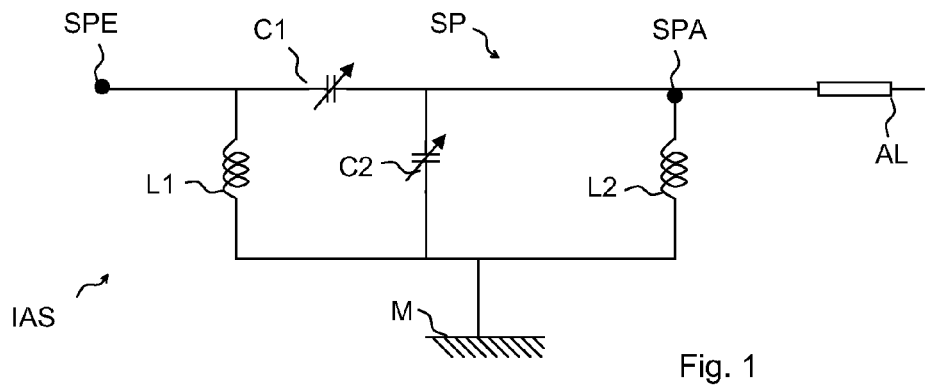
FIG. 1 shows an impedance matching circuit IAS with two capacitive elements with variable capacitance, two inductive elements, and an antenna line.

FIG. 1 shows an impedance matching circuit IAS for planar antennas, which has low complexity and enables a sufficient tuning range. A variable capacitive element C1 is connected in signal path SP with signal path input SPE and signal path output SPA. In addition, there is an inductive element L1 connected between the signal path input SPE and ground M. In addition, a variable capacitive element C2 and an inductive element L2 are connected between the signal path output SPA and ground M. Further, the signal path output SPA is connected to an antenna line AL.

Figure 2:
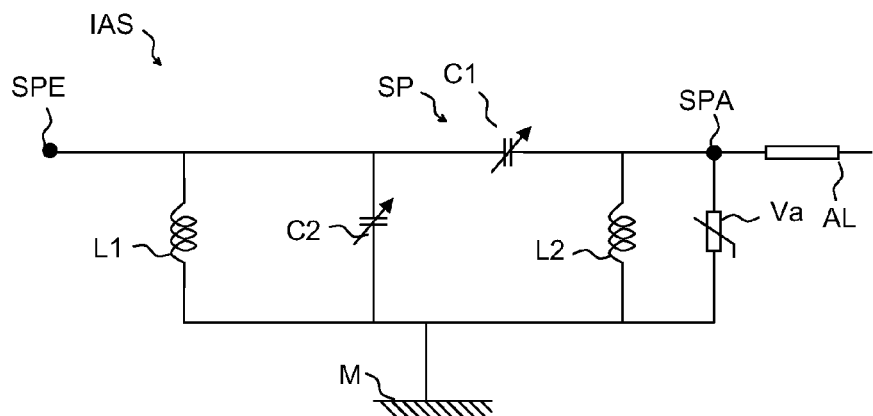
FIG. 2 shows an antenna matching circuit IAS with two variable capacitive elements and two inductive elements and an antenna line.

FIG. 2 shows an alternative embodiment of the impedance matching circuit IAS, in which, in contrast to FIG. 1, the second variable capacitive element C2 is connected between the signal path input SPE and ground M. In addition, a variable resistive element VA is connected between the signal path output SPA and ground M.

Both the first inductive element L1 and the second inductive element L2 are, in addition to their function as HF impedance elements, ESD protective elements, in order to discharge through ground voltage peaks that are introduced into the impedance matching circuit via the antenna line AL. In this way, subsequent circuits that are connected to the signal path input are protected without the impedance matching circuit becoming more complicated due to additional, specially added protective elements.

Figure 3:
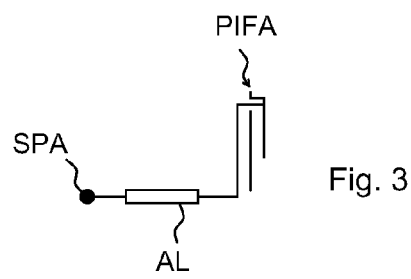
FIG. 3 shows the connection of the antenna line to the PIFA.

FIG. 3 schematically shows the connection of the signal path output SPA to the PIFA via the antenna line AL.

Figure 4:
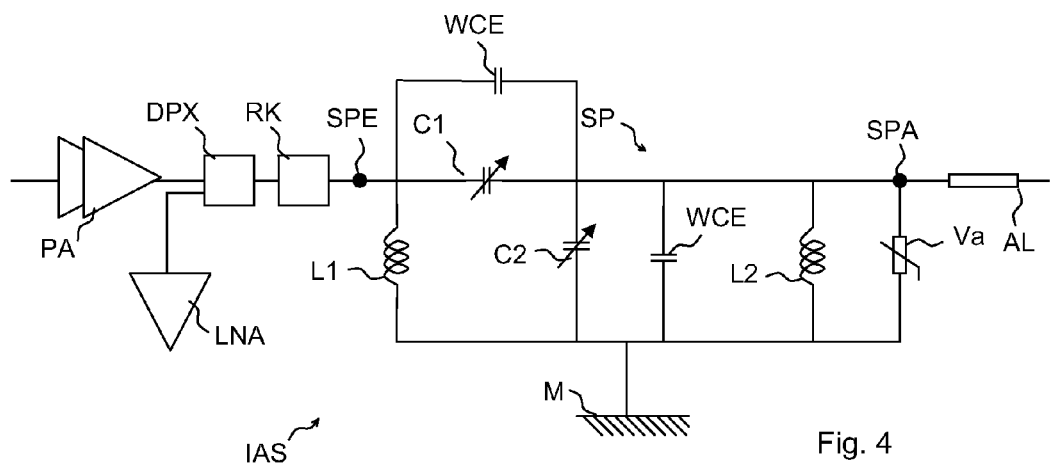
FIG. 4 shows an impedance matching circuit IAS with additional parallel capacitive elements and a directional coupler in the signal path.

FIG. 4 shows an embodiment of the impedance matching circuit IAS in which the variable capacitive elements C1 and C2 are connected in parallel with other fixed capacitive elements WCE. Capacitive elements with fixed capacitance in general have higher Q factors, so that a parallel circuit of a capacitive element with variable capacitance C1 or C2 and a capacitive element with fixed capacitance WCE overall has a higher Q factor than the variable capacitive element by itself. The capacitances of parallel connected capacitive elements add, so this must be taken into account in designing the capacitance values. Further, the signal path input SPE of the impedance matching circuit IAS is connected to a part of a front end circuit, symbolized here by a directional coupler RK, a duplexer DPX, a receiving amplifier LNA and a sending amplifier PA. The duplexer DPX connects a sending path and a receiving path to the signal path SP. The directional coupler RK is connected between the duplexer DPX and the signal path input SPE.

Figure 5:
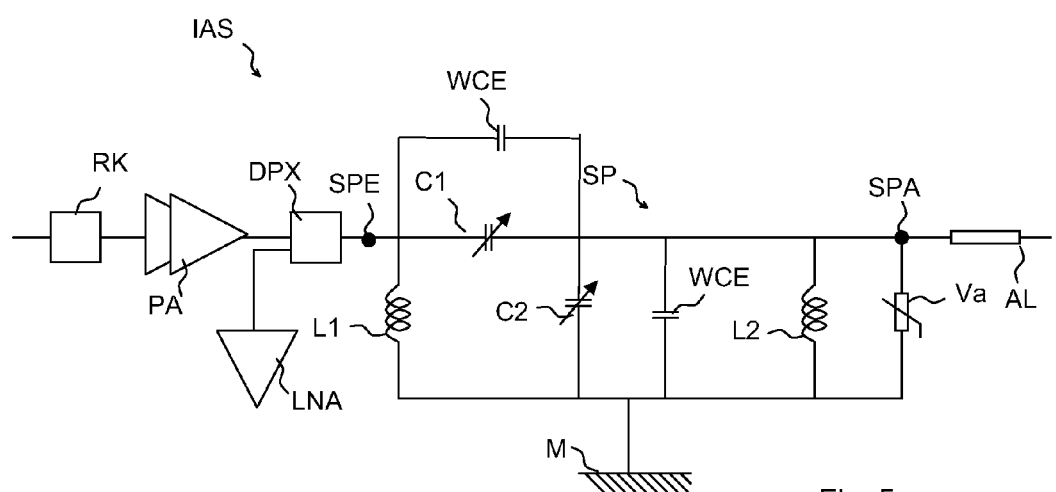
FIG. 5 shows an impedance matching circuit IAS with additional parallel connected capacitive elements and a directional coupler connected in series in the signal path.

FIG. 5 shows an alternative to the impedance matching circuit from FIG. 4, where the directional coupler RK is not connected between the duplexer DPX and signal path input SPE, but rather in the sending path. The sending amplifier PA is connected between the directional coupler RK and duplexer DPX.

Figure 6:
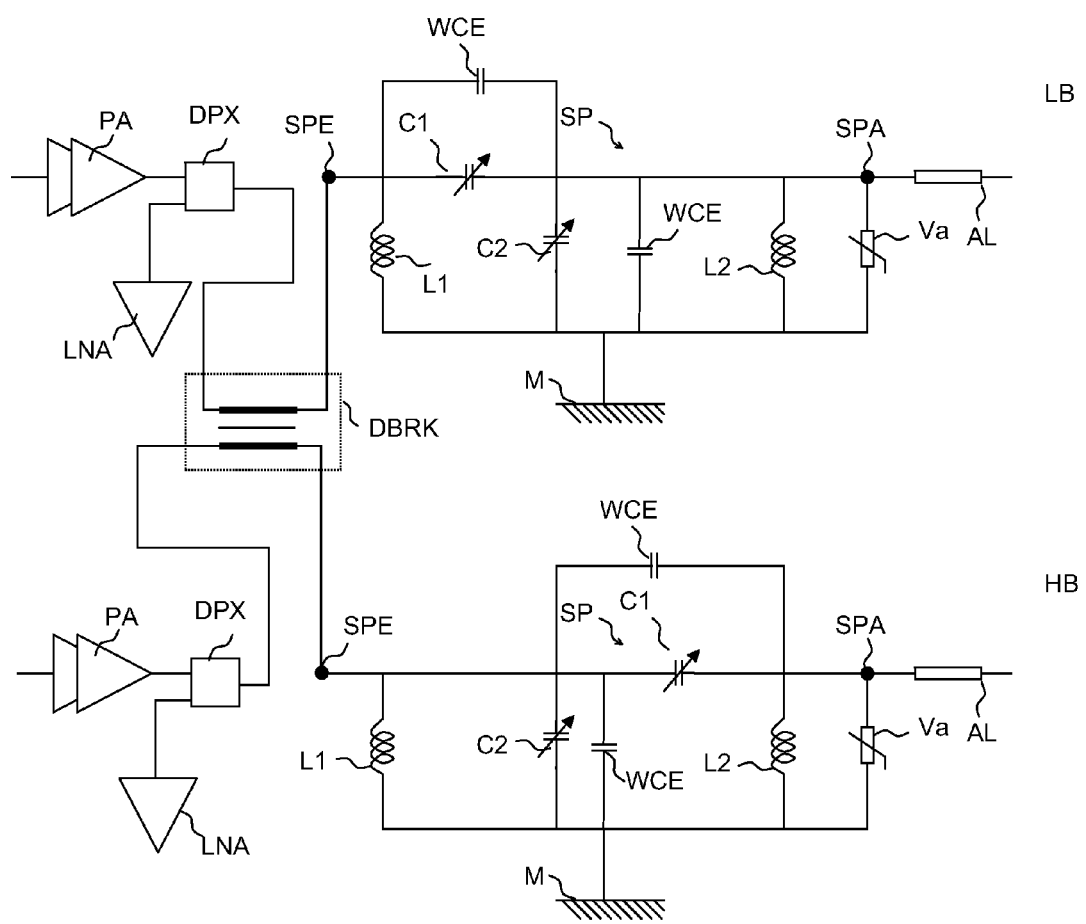
FIG. 6 shows two impedance matching circuits that are intended for different frequency ranges, with a common dual band directional coupler.

FIG. 6 shows an embodiment in which two impedance matching circuits intended for different frequency ranges jointly use a dual band directional coupler DBRK. The sides of this dual band directional coupler DBRK are each connected to one segment of the signal path SP. These segments are connected in the relevant signal path between the duplexer DPX and the signal path input SPE.

Figure 7:
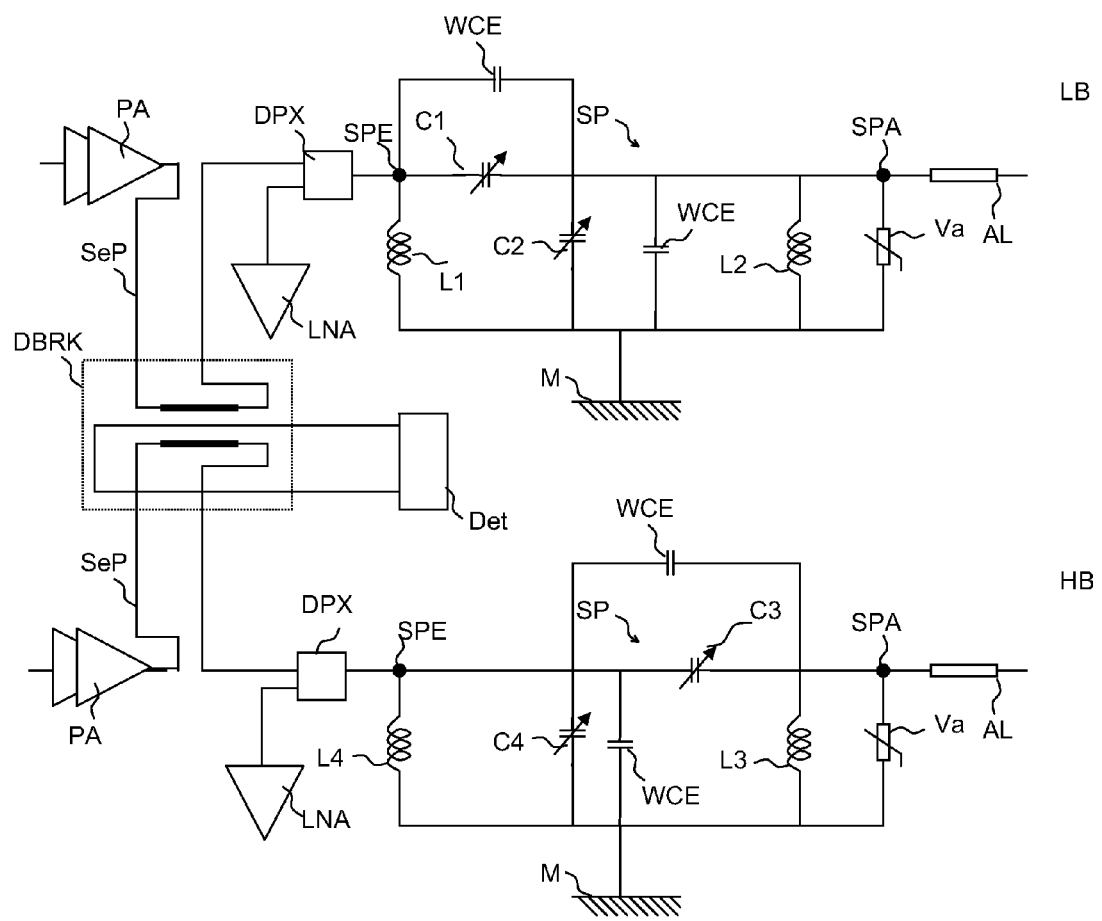
FIG. 7 shows two impedance matching circuits that are intended for use in different frequency ranges, with a common dual band directional coupler.

In contrast, FIG. 7 shows an embodiment in which a dual band directional coupler DBRK is connected to two sending paths that are intended for two different frequency ranges (e.g., low band LB and high band HB), the sending paths belonging to two impedance matching circuits each intended for one of the two different frequency ranges. The relevant segment that is coupled to the dual band directional coupler DBRK in each case lies in the sending path SeP between the sending amplifier PA and the duplexer DPX. A detector Det connected to the dual band directional coupler registers the quality of the impedance matching, which in turn is the starting point in the tuning of the adjustable capacitance of capacitive elements C1 and C2. FIG. 7 also shows similar elements C3, C4, L3 and L4 in the high band section HB.

A filter circuit in accordance with the invention is not limited to one of the described embodiment examples. Combinations and variations of the indicated characteristics, which also comprise still other inductive or capacitive elements, for example, are also embodiment examples in accordance with the invention.

The invention claimed is:
1. An impedance matching circuit for matching planar antennas, the circuit comprising:
a signal path with a signal path input and a signal path output;
a first capacitive element with variable capacitance connected between the signal path input and signal path output;
a second capacitive element with variable capacitance connected between the signal path and ground;
an additional capacitive element connected in parallel with one of the first and second capacitive elements, wherein a parallel combination of the first, second and additional capacitive elements has a higher Q factor than the one of the first and second capacitive elements without the additional capacitive element;
a first inductive element connected between the signal path input and ground, a second inductive element connected between the signal path output and ground; and an antenna line with an impedance between 30 and 60 ohm connected to the signal path output.

2. The impedance matching circuit as in claim 1, where the second capacitive element is connected between the signal path output and ground.

3. The impedance matching circuit as in claim 1, where the second capacitive element is connected between the signal path input and ground.

4. The impedance matching circuit as in claim 1, further comprising a resistive element with voltage-dependent resistance connected between the signal path output and ground.

5. The impedance matching circuit as in claim 1,
wherein the first and second inductive elements have Q factors greater than or equal to 15 and inductances between 1 and 30 nH,
wherein the first capacitive element has a Q factor greater than 10 and a capacitance that is adjustable in an interval that lies between 0.5 and 13 pF, and
wherein the second capacitive element has a Q factor greater than or equal to 10 and a capacitance that is adjustable in an interval that lies between 0.5 and 8.0 pF.

6. The impedance matching circuit as in claim 1 for use in a mobile communications device with a sending path, a receiving path and a planar antenna of a PIFA type,
wherein the signal path input is connected to the sending path and the receiving path and
wherein the antenna line is connected between the signal path output and the planar antenna.

7. The impedance matching circuit as in claim 6, which matches the sending path in a sending frequency band and the receiving path in a receiving frequency band to the planar antenna with a standing wave ratio in the sending path that is less than 3:1 and with a standing wave ratio in the receiving path that is less than 4:1.

8. The impedance matching circuit as in claim 1 for use in W-CDMA frequency bands between 500 and 4500 MHz.

9. The impedance matching circuit as in claim 1, wherein one of the first and second variable capacitance capacitive elements has a tuning range of at least 2.5:1.

10. The impedance matching circuit as in claim 1, wherein one of the first and second capacitive elements with variable capacitance: comprises an element selected from the group consisting of: an adjustable capacitor with a barium strontium titanate dielectric layer, a capacitive element made in CMOS technology, a circuit of MEMS capacitors, a semiconductor varactor diode, a capacitive element made in NMOS technology, a 5-bit array, and a gallium arsenide capacitive element.

11. The impedance matching circuit as in claim 1, wherein both the first and second capacitive elements with variable capacitance comprise an element selected from the group consisting of: an adjustable capacitor with a barium strontium titanate dielectric layer, a capacitive element made in CMOS technology, a circuit of MEMS capacitors, a semiconductor varactor diode, a capacitive element made in NMOS technology, a 5-bit array, and a gallium arsenide capacitive element.

12. The impedance matching circuit as in claim 1, wherein the first and second inductive elements are designed as metallizations in a multilayer substrate, chosen from the substrate comprising HTCC, LTCC, FR4, or laminate.

13. The impedance matching circuit as in claim 1, wherein the first and second capacitive elements with variable capacitance are designed in the same way and are arranged in a same housing.

14. The impedance matching circuit as in claim 1, further comprising control lines to vary a capacitance that are jointly used by the two capacitive elements with variable capacitance.

15. The impedance matching circuit as in claim 1, wherein the impedance matching circuit operates in a frequency range selected from the group consisting of 0.5 GHz.ltoreq.f.ltoreq.1.7 GHz, 1.7 GHz.ltoreq.f.ltoreq.2.5 GHz, and f.gtoreq.2.5 GHz.

16. The impedance matching circuit as in claim 1, further comprising with a directional coupler connected in the signal path.

17. A multiband matching circuit that comprises two impedance matching circuits, each according to claim 1, and a dual band directional coupler, wherein the two impedance matching circuits are configured for use in different frequency bands, and the dual band directional coupler is connected to signal paths of both impedance matching circuits.

18. A multiband matching circuit that comprises two or more impedance matching circuits, each according to claim 1, and a directional coupler assigned to each impedance matching circuit, wherein the two or more impedance matching circuits are configured for use in different frequency bands, and the assigned directional couplers are each connected to the signal path of the impedance matching circuit.

19. A multiband matching circuit that comprises a first, a second, and a third impedance matching circuit, each according to claim 1, and a dual band directional coupler, wherein signal paths of the second and third impedance matching circuits are connected to the same dual band directional coupler.

* * * * *